(12) United States Patent
Jeong et al.

(10) Patent No.: US 12,101,960 B2
(45) Date of Patent: Sep. 24, 2024

(54) DISPLAY APPARATUS

(71) Applicant: LG Display Co., Ltd., Seoul (KR)

(72) Inventors: SangHoon Jeong, Iksan-si (KR); HyoYoung Jun, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/141,233

(22) Filed: Apr. 28, 2023

(65) Prior Publication Data

US 2023/0263005 A1 Aug. 17, 2023

Related U.S. Application Data

(63) Continuation of application No. 17/380,913, filed on Jul. 20, 2021, now Pat. No. 11,678,506.

(30) Foreign Application Priority Data

Jul. 21, 2020 (KR) .................. 10-2020-0090207

(51) Int. Cl.
*H10K 50/844* (2023.01)
*G06F 3/041* (2006.01)
(Continued)

(52) U.S. Cl.
CPC ......... *H10K 50/844* (2023.02); *G06F 3/0412* (2013.01); *H10K 59/40* (2023.02);
(Continued)

(58) Field of Classification Search
CPC .... H10K 50/84; H10K 50/844; H10K 59/131; H10K 59/40; H10K 71/00;
(Continued)

(56) References Cited

U.S. PATENT DOCUMENTS 10,497,896 B2 * 12/2019 Lee ................... H10K 59/1315
11,455,067 B2 9/2022 Park
(Continued)

FOREIGN PATENT DOCUMENTS

CN 111916474 A 11/2020
EP 3 291 324 A1 3/2018
(Continued)

*Primary Examiner* — Julie Anne Watko
(74) *Attorney, Agent, or Firm* — Birch, Stewart, Kolasch & Birch, LLP

(57) ABSTRACT

A display apparatus can include a substrate including a first area having a flat portion and a second area having a curved portion; a transistor on the substrate; a dam on a non-display area in the first and second areas; an encapsulation part on the transistor and including a first inorganic encapsulation layer, a second inorganic encapsulation layer and an organic encapsulation layer between the first inorganic encapsulation layer and second inorganic encapsulation layer; a first inorganic insulating layer on the encapsulation part in the first and second areas. Also, the display apparatus can include a first touch part on the first inorganic insulating layer in the first area and the second area, a second inorganic insulating layer on the first touch part in the first and second areas, and a second touch part on the second inorganic insulating layer in the first and second areas.

18 Claims, 7 Drawing Sheets

(51) Int. Cl.
*G06F 3/044* (2006.01)
*G09G 3/3208* (2016.01)
*H10K 59/12* (2023.01)
*H10K 59/40* (2023.01)
*H10K 50/84* (2023.01)

(52) U.S. Cl.
CPC .. *G06F 3/0448* (2019.05); *G06F 2203/04102* (2013.01); *G06F 2203/04112* (2013.01); *G09G 3/3208* (2013.01); *H10K 50/84* (2023.02); *H10K 59/12* (2023.02)

(58) Field of Classification Search
CPC ......... H10K 2102/00; H10K 2102/311; H10K 59/12; H10K 59/122; G06F 3/0412; G06F 3/0443; G06F 3/0446; G06F 3/0448; G06F 2203/04102; G06F 2203/04112; G09G 3/3208; H01L 27/323; H01L 27/3244; H01L 27/3246; H01L 27/3276; H01L 51/5237; H01L 51/5253; H01L 51/56; H01L 2251/301; H01L 2251/5338; H01L 51/301; H01L 2251/2338
See application file for complete search history.

(56) References Cited

U.S. PATENT DOCUMENTS

| | | |
|---|---|---|
| 2006/0197445 A1 | 9/2006 | Watanabe |
| 2015/0207102 A1* | 7/2015 | Jeong ................. H04M 1/0268 257/40 |
| 2016/0218151 A1 | 7/2016 | Kwon et al. |
| 2019/0131572 A1* | 5/2019 | Gwon ................. G09G 3/3225 |
| 2019/0317626 A1* | 10/2019 | Lee ....................... G06F 3/0416 |
| 2020/0357856 A1* | 11/2020 | Koo ..................... G06F 3/0412 |
| 2021/0020865 A1* | 1/2021 | Kim ................... H10K 59/8791 |
| 2021/0200386 A1 | 7/2021 | Park |
| 2022/0206636 A1 | 8/2022 | Lu |
| 2022/0262865 A1 | 8/2022 | Hou et al. |

FOREIGN PATENT DOCUMENTS

| | | | | |
|---|---|---|---|---|
| EP | 3477726 A1 * | 5/2019 | ......... | H01L 27/3211 |
| EP | 3252573 B1 * | 11/2019 | ......... | G02F 1/13338 |

* cited by examiner

DISPLAY APPARATUS

CROSS-REFERENCE TO RELATED APPLICATIONS

This application is a Continuation Applications of U.S. patent application Ser. No. 17/380,913, filed on Jul. 20, 2021, which claims priority to Korean Patent Application No. 10-2020-0090207 filed on Jul. 21, 2020 in the Korean Intellectual Property Office, the entire contents of all these applications being expressly incorporated herein by reference into the present application.

BACKGROUND

Technical Field

The present disclosure relates to a display apparatus, and more particularly, to a display apparatus with improved performance.

Description of the Related Art

Display apparatuses used in computer monitors, TVs, mobile phones, etc. include an organic light emitting display (OLED) or the like that emits light by itself and a liquid crystal display (LCD) or the like that requires a separate light source.

The display apparatuses are being applied in a wide range, not only to computer monitors and TVs but also to personal portable apparatuses, and research is being conducted for a display apparatus having a large display area with decreased volume and weight.

Among the display apparatuses, there is a touch screen-integrated display apparatus including a touch part capable of recognizing a user's touch. The user of the touch screen-integrated display apparatus can directly input information using a finger or a pen, and thus, is widely applied to navigation, portable terminals, and home appliances.

To manufacture a touch screen-integrated display apparatus, a method of manufacturing a separate touch screen panel and then bonding the touch screen panel to a display panel has been used. However, when the touch screen panel is separately manufactured and bonded as described above, there can be various problems such as an increase in the thickness of the touch screen-integrated display apparatus and an increase in the process time.

SUMMARY OF THE DISCLOSURE

Accordingly, the inventors of the present disclosure invented a touch screen-integrated display apparatus having a new structure for manufacturing a touch screen panel together in a process of manufacturing a display panel. For example, the inventors of the present disclosure invented a manufacturing process of forming components that directly constitute a touch screen on an encapsulation unit of a display panel and a touch screen-integrated display apparatus having a new structure by the above manufacturing process. The touch screen-integrated display apparatus includes a plurality of light emitting diodes disposed on a substrate, an encapsulation part disposed on the light emitting diodes, and touch parts disposed on the encapsulation part. In order to form the touch parts, a process of forming a first inorganic insulating layer on an encapsulation part, forming a first touch part on the first inorganic insulating layer, forming a second inorganic insulating layer on the first inorganic insulating layer and the first touch part, and forming a second touch part and an organic insulating layer on the second inorganic insulating layer is used. In this case, both the first inorganic insulating layer and the second inorganic insulating layer used for the touch part are formed on at least a front surface of a display area of the display panel.

The first inorganic insulating layer and the second inorganic insulating layer of the touch part can be formed of an inorganic material, and therefore, can have relatively weak ductility. In particular, when the touch screen-integrated display apparatus includes a bending area, stress generated in the bending area can increase, so cracks may occur in components disposed in the bending area, in particular, inorganic layers, and a panel may be damaged due to moisture permeation at a portion where the cracks have occurred.

Accordingly, the inventors of the present disclosure formed the first inorganic insulating layer and the second inorganic insulating layer by lowering a flow rate of ammonia $NH_3$ gas during the process of forming the first inorganic insulating layer and the second inorganic insulating layer. When the first inorganic insulating layer and the second inorganic insulating layer are formed by lowering the flow rate of ammonia gas, the first inorganic insulating layer and the second inorganic insulating layer can have relatively increased ductility. Accordingly, the cracks of the inorganic layers in the bending area can be reduced, and damage to the panel due to the moisture permeation can be reduced.

However, when the first inorganic insulating layer and the second inorganic insulating layer are formed by lowering the flow rate of ammonia gas, light transmittance and a viewing angle can decrease in some sub-pixels.

Accordingly, the inventors of the present disclosure invented a display apparatus with a new structure capable of improving the light transmittance and the viewing angle while reducing the stress generated in the bending area by reducing the thicknesses of the first inorganic insulating layer and the second inorganic insulating layer disposed on the emission area of the bending area.

An aspect of the present disclosure is to provide a display apparatus capable of improving reliability of a bending area.

An aspect of the present disclosure is to provide a display apparatus capable of improving light transmittance and viewing angle characteristics.

To achieve these and other aspects of the inventive concepts, as embodied and broadly described herein, a display apparatus comprises a substrate having a display area including a plurality of sub-pixels, the plurality of sub-pixels including an emission area and a non-emission area, a plurality of light emitting diodes disposed at the plurality of sub-pixels, an encapsulation part covering the plurality of light emitting diodes in the display area, a first inorganic insulating layer disposed on the encapsulation part, a first touch part disposed on the first inorganic insulating layer, a second inorganic insulating layer disposed on the first touch part and including an opening disposed at an area overlapping the emission area disposed at one or more sub-pixels among the plurality of sub-pixels, and a second touch part disposed on the first inorganic insulating layer and the second inorganic insulating layer.

In another aspect, a display apparatus comprises a substrate including a display area and a non-display area, a plurality of sub-pixels disposed at the display area and including an emission area and a non-emission area, a plurality of light emitting diodes disposed on the plurality of sub-pixels, an encapsulation part disposed on the plurality of sub-pixels; a first inorganic insulating layer disposed on the encapsulation part, a first touch part disposed at a portion of the first inorganic insulating layer; a second inorganic insulating layer disposed on the first touch part, and a second touch part disposed on the second inorganic insulating layer. The first inorganic insulating layer at one or more sub-pixels of the plurality of sub-pixels is exposed at an area corresponding to the emission area.

According to an embodiment of the present disclosure, it is possible to increase ductility of a bending area and reduce stress generated in the bending area by forming an inorganic insulating layer disposed on a light emitting diode at a low flow rate.

According to an embodiment of the present disclosure, it is possible to improve reliability of a bending area by reducing cracks due to stress generated in the bending area.

According to an embodiment of the present disclosure, it is possible to improve light transmittance and viewing angle characteristics by reducing a thickness of an inorganic insulating layer disposed on a light emitting diode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION OF THE EMBODIMENTS

Figure 1:
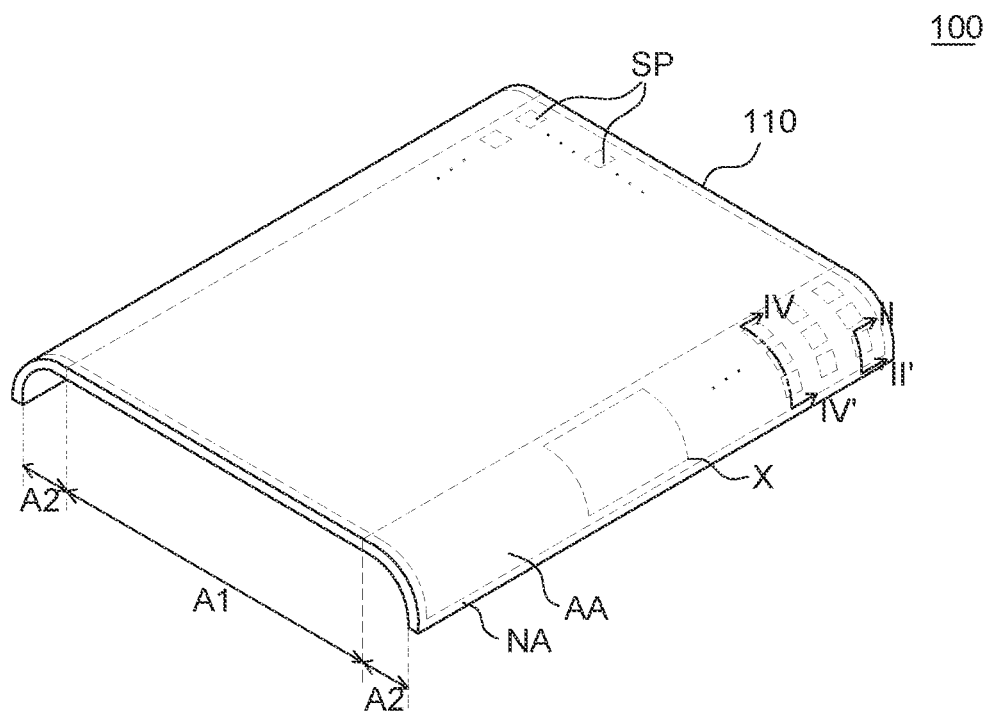
FIG. 1 is a perspective view of a display apparatus according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings. All the components of each display apparatus according to all embodiments of the present disclosure are operatively coupled and configured.

FIG. 1 is a perspective view of a display apparatus according to an embodiment of the present disclosure. In FIG. 1, among various components of a display apparatus 100, a substrate 110 and a plurality of sub-pixels SP are illustrated for convenience of description.

Referring to FIG. 1, the substrate 110 is a support member configured to support other components of the display apparatus 100 and can be formed of an insulating material. For example, the substrate 110 can be formed of glass, resin, or the like. Further, the substrate 110 can be formed of a polymer or plastic such as polyimide PI, or can be formed of a material having flexibility.

The substrate 110 can include a first area A1 and a second area A2. The first area A1 is an area which is formed in a flat surface, and the second area A2 is an area which is formed in a curved surface. The first area A1 can be a flat area, and the second area A2 can be a curved area. The first area A1 can be a flat portion, and the second area A2 can be a curved portion or a bent portion. For example, the second area A2 can be a curved area with increasing inclination as it is further away from the first area A1. For example, the second area A2 can be disposed at both sides of the first area A1, and have increasing inclination as it is further away from the first area A1. However, embodiments of the present disclosure are not limited thereto, and each of the second areas A2 disposed at both sides of the first area A1 can be disposed having a different curvature. Also, the second area A2 can be disposed at only one side of the first area A1 or can be disposed at all sides of the first area A1. For example, when the first area A1 has four sides, the second area A2 can be disposed at one or more of the four sides, or can be disposed at all sides of the four sides.

The substrate 110 includes a display area AA and a non-display area NA. The display area AA and the non-display area NA can be disposed at the first area A1 and the second area A2 of the substrate 110, respectively.

The display area AA is an area that displays an image. A plurality of sub-pixels SP for displaying an image and a circuit part for driving the plurality of sub-pixels SP can be disposed at the display area AA. The circuit part can include various thin film transistors, capacitors, and wirings for driving the sub-pixels SP. For example, the circuit part can include various components such as a driving thin film transistor, a switching thin film transistor, a storage capacitor, a gate wiring, and a data wiring, but is not limited thereto.

The non-display area NA is an area in which an image is not displayed, and is an area in which various wirings and driver ICs for driving the sub-pixels SP disposed at the display area AA are disposed. For example, various driver ICs such as a gate driver IC and a data driver IC can be disposed at the non-display area NA.

In FIG. 1, the non-display area NA is illustrated to surround the display area AA, but the non-display area NA can be an area extending from one side of the display area AA, but is not limited thereto.

The plurality of sub-pixels SP can be disposed at the display area AA of the substrate 110. Each of the plurality of sub-pixels SP can be an individual unit that emits light, and a light emitting diode and a driving circuit are formed at each of the plurality of sub-pixels SP. For example, the plurality of sub-pixels SP can include a red sub-pixel, a green sub-pixel, and a blue sub-pixel, and the plurality of sub-pixels SP can further include a white sub-pixel, but is not limited thereto.

Hereinafter, the plurality of sub-pixels SP will be described in more detail with reference to FIG. 2.

Figure 2:
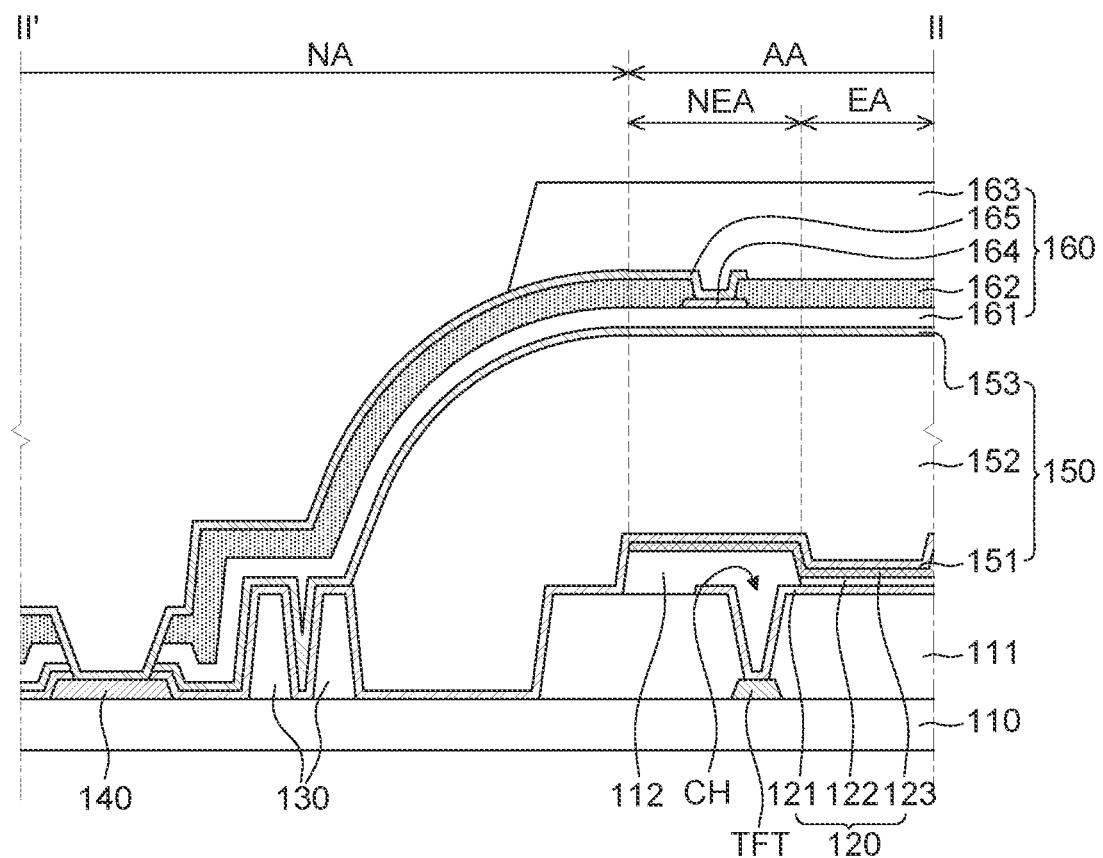
FIG. 2 is a cross-sectional view of the display apparatus taken along line II-II' of FIG. 1.
Figure 3:
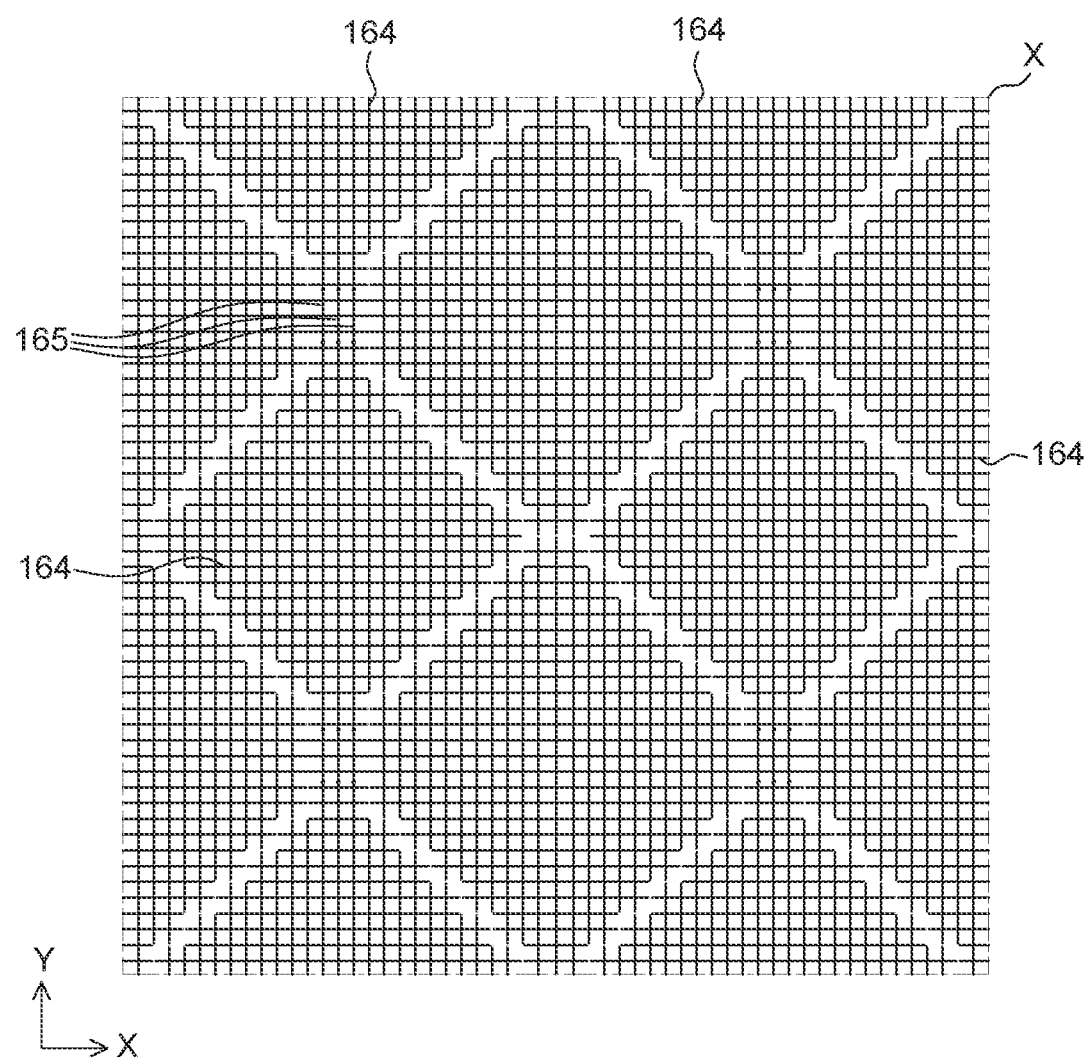
FIG. 3 is an enlarged plan view of an area X of FIG. 1.

FIG. 2 is a cross-sectional view taken along line II-II' of FIG. 1. FIG. 3 is an enlarged plan view of an area X of FIG. 1. In FIG. 3, among various components of the display apparatus 100, a first touch part 164 and a second touch part 165 are illustrated for convenience of description.

With reference to FIG. 2, the display apparatus 100 according to the embodiment includes the substrate 110, a transistor TFT, a planarization layer 111, a light emitting diode 120, a bank 112, a pad part 140, a dam 130, an encapsulation part 150, and a touch part 160.

The transistor TFT can be disposed on the substrate 110. The transistor TFT transfers a data voltage to the plurality of sub-pixels SP.

The transistor TFT can include a gate electrode, an active layer, a source electrode, and a drain electrode.

An active layer can be disposed on the substrate 110. The active layer can include oxide semiconductor, amorphous silicon, polysilicon, or the like.

Depending on a structure of the transistor TFT, a gate electrode can be disposed above or below the active layer. The gate electrode can be formed of a conductive material, for example, copper (Cu), aluminum (Al), molybdenum (Mo), titanium (Ti), or an alloy thereof, but is not limited thereto.

A gate insulating layer can be disposed between the active layer and the gate electrode. The gate insulating layer is a layer for insulating the gate electrode and the active layer, and can be formed of an insulating material. For example, the gate insulating layer can be formed of a single layer or a multi-layer of silicon oxide SiOx or silicon nitride SiNx, but is not limited thereto.

A source electrode and a drain electrode electrically connected to the active layer and spaced apart from each other can be disposed. The source electrode and the drain electrode can be formed of conductive materials, for example, copper (Cu), aluminum (Al), molybdenum (Mo), titanium (Ti), or an alloy thereof, but are not limited thereto.

Depending on the structure of the transistor TFT, an interlayer insulating layer or the like can be further disposed between the gate electrode, the source electrode, and the drain electrode to insulate the gate electrode, the source electrode, and the drain electrode, but is not limited thereto.

The planarization layer 111 can be disposed on the transistor TFT. The planarization layer 111 can planarize an upper portion of some portion of the substrate 110. For example, the planarization layer 111 can be disposed at the display area AA, and the planarization layer 111 may not be disposed at all or some portion of the non-display area NA.

The planarization layer 111 can be formed of a single layer or a multi-layer, and can be formed of an organic material. For example, the planarization layer 111 can be formed of an acrylic organic material, but is not limited thereto. The planarization layer 111 can include a contact hole CH for electrically connecting the transistor TFT and the light emitting diode 120.

The light emitting diode 120 can be disposed on the planarization layer 111. The light emitting diode 120 can be a self-luminous element that emits light, and can be driven by receiving a voltage from a transistor TFT or the like. The light emitting diode 120 can include an anode 121, a light emitting layer 122, and a cathode 123.

The anode 121 can be disposed separately for each sub-pixel SP on the planarization layer 111. The anode 121 can be electrically connected to the transistor TFT through the contact hole CH formed in the planarization layer 111. The anode 121 can be formed of a conductive material capable of supplying holes to the light emitting layer 122. For example, the anode 121 can be formed of a reflective layer that is formed of transparent conductive materials such as tin oxide (TO), indium tin oxide (ITO), indium zinc oxide (IZO), and indium zinc tin oxide (ITZO), and a material having excellent reflectivity such as silver (Ag) and silver alloy, but is not limited thereto.

The bank 112 can be disposed on the anode 121 and the planarization layer 111. The bank 112 can be an insulating layer for dividing sub-pixels SP adjacent to each other. The bank 112 can be disposed to expose a part of the anode 121, and the bank 112 can be an organic insulating material disposed to cover an edge of the anode 121.

The light emitting layer 122 can be disposed on the anode 121. The light emitting layer 122 can be formed of one light emitting layer 122 or can have a structure in which a plurality of light emitting layers 122 emitting light of different colors is stacked. For example, the plurality of light emitting layers 122 can have a structure in which light emitting layers emitting light of the same color are stacked. For example, the same color can be one of red, green, and blue. As another example, the plurality of light emitting layers 122 can have a structure in which the light emitting layers emitting light of different colors are stacked. For example, the plurality of light emitting layers 122 can have a stacked structure of a first stack or more. The light emitting layer of the first stack can be formed in one or more of blue, deep blue, and sky blue, and the light emitting layer of a second stack can be formed in one or more of yellow, yellow green, green, and red, but is not limited thereto. When a third stack is included, the light emitting layer can be formed in the same color as the light emitting layer of the first stack, but is not limited thereto. The light emitting diode 120 can further include a hole injection layer, a hole transport layer, an electron transport layer, and an electron injection layer. With reference to FIG. 2, the light emitting layers 122 disposed in each sub-pixel SP are shown as being separated and disposed for each sub-pixel SP, but is not limited thereto. For example, all or some of the light emitting layers 122 can be formed of a single layer over a plurality of sub-pixels SP. In addition, the light emitting layer 122 can be an organic light emitting layer formed of an organic material, but is not limited thereto. For example, the light emitting layer 122 can be a quantum dot light emitting layer or a micro LED.

The cathode 123 can be disposed on the light emitting layer 122. The cathode 123 can be formed of a conductive material capable of supplying electrons to the light emitting layer 122. For example, the cathode 123 can be formed of indium tin oxide (ITO), indium zinc oxide (IZO), indium tin zinc oxide (ITZO), zinc oxide (ZnO), and tin oxide (TO)-based transparent conductive oxide or a ytterbium (Yb) alloy. Alternatively, the cathode 123 can be formed of a metal material having a very thin thickness, but is not limited thereto. With reference to FIG. 2, the cathodes 123 disposed at each sub-pixel SP is shown to be connected to each other, but can be separated and disposed for each sub-pixel SP like the anode 121, but are not limited thereto.

The display area AA can include an emission area EA and a non-emission area NEA between a plurality of emission areas EA.

An area in which each of the plurality of light emitting diodes 120 is disposed can be a plurality of emission areas EA. Each of the plurality of emission areas EA can be an area that can independently emit light of one color, an area corresponding to a plurality of sub-pixels SP, and an area in which the bank 112 is not disposed. For example, the plurality of emission areas EA can include a red emission area, a green emission area, and a blue emission area, but is not limited thereto. The plurality of emission areas EA can be disposed to be spaced apart from each other, and, for example, can be disposed in a lattice shape arranged in a row direction and a column direction, but is not limited thereto.

An area in which the plurality of light emitting diodes 120 is not disposed can be a non-emission area NEA. The non-emission area NEA is an area disposed between the plurality of emission areas EA, and can be an area in which the bank 112 is disposed. The non-emission area NEA is disposed to surround the plurality of emission areas EA, and can be formed in a mesh form.

The dam 130 can be disposed at the non-display area NA. For example, the dam 130 is disposed on the substrate 110 at the non-display area NA. The dam 130 is disposed to control a spread of an organic encapsulation layer 152 among the encapsulation part 150 disposed to cover the display area AA. For example, the dam 130 can suppress overflow of the organic encapsulation layer 152 of the encapsulation part 150. One or more dams 130 can be configured, and the number of dams to be disposed is not limited thereto.

The pad part 140 can be disposed at the non-display area NA. The pad part 140 can be disposed outside the dam 130. A signal can be input to a circuit part, a driver IC, and the like formed at the substrate 110 through the pad part 140. For example, the pad part 140 can supply a signal supplied from the outside to the circuit part, the driver IC, or the like of the substrate 110. For example, the pad part 140 can supply a signal for driving the touch part 160 to the touch part 160 and receive a signal for a user's touch input from the touch part 160.

The encapsulation part 150 can be disposed on the light emitting diode 120. The encapsulation part 150 is a sealing member that protects the light emitting diode 120 from external moisture, oxygen, and impact. The encapsulation part 150 can be disposed to cover the entire display area AA in which the light emitting diode 120 is disposed, and the encapsulation part 150 can be disposed to cover a part of the non-display area NA extending from the display area AA. The encapsulation part 150 can include a first inorganic encapsulation layer 151 that is formed of an inorganic material, an organic encapsulation layer 152 that is disposed on the first inorganic encapsulation layer 151 and formed of an organic material, and a second inorganic encapsulation layer 153 that is disposed on the organic encapsulation layer 152.

The first inorganic encapsulation layer 151 can seal the display area AA to protect the light emitting diode 120 from oxygen and moisture penetrating into the display area AA. The first inorganic encapsulation layer 151 can be disposed not only in the display area AA, but also in the non-display area NA extending from the display area AA, and can be disposed to cover the dam 130 or the like of the non-display area NA. The first inorganic encapsulation layer 151 can be formed of an inorganic material such as silicon nitride (SiNx), silicon oxide (SiOx), and silicon oxynitride (SiON), but is not limited thereto.

An organic encapsulation layer 152 can be disposed on the first inorganic encapsulation layer 151. The organic encapsulation layer 152 is a layer for planarizing an upper portion of the first inorganic encapsulation layer 151, and can fill cracks that can occur in the first inorganic encapsulation layer 151 and planarize an upper portion of a foreign material when the foreign material is formed on the first inorganic encapsulation layer 151. The organic encapsulation layer 152 can be disposed up to the display area AA and a portion of the non-display area NA extending from the display area AA, and can be disposed inside the dam 130. The organic encapsulation layer 152 can be formed of an epoxy-based or acrylic-based polymer, but is not limited thereto.

A second inorganic encapsulation layer 153 can be disposed on the organic encapsulation layer 152. The second inorganic encapsulation layer 153 can seal the organic encapsulation layer 152 together with the first inorganic encapsulation layer 151 in a manner that contacts the first inorganic encapsulation layer 151 at the outer portion of the display apparatus 100. The second inorganic encapsulation layer 153 can be disposed up to a portion of the non-display area NA extending from the display area AA, and the second inorganic encapsulation layer 153 can be disposed to contact the first inorganic encapsulation layer 151 disposed at the non-display area NA. The second inorganic encapsulation layer 153 can be formed of an inorganic material such as silicon nitride (SiNx), silicon oxide (SiOx), and silicon oxynitride (SiON), but is not limited thereto.

FIG. 2 illustrates that the encapsulation part 150 can include the first inorganic encapsulation layer 151, the organic encapsulation layer 152, and the second inorganic encapsulation layer 153, but the number of inorganic encapsulation layers 151 and 153 and the number of organic encapsulation layers 152 included in the encapsulation part 150 are not limited thereto.

The touch part 160 can be disposed on the encapsulation part 150. The touch part 160 can be disposed at the display area AA including the light emitting diode 120 to sense a touch input. The touch part 160 can detect external touch information input by using a user's finger, a touch pen, or the like. The touch part 160 can include a first inorganic insulating layer 161, a second inorganic insulating layer 162, an organic insulating layer 163, a first touch part 164, and a second touch part 165.

The first inorganic insulating layer 161 can be disposed on the encapsulation part 150. The first inorganic insulating layer 161 can be in contact with the second inorganic encapsulation layer 153 of the encapsulation part 150. The first inorganic insulating layer 161 can be formed of an inorganic material. For example, the first inorganic insulating layer 161 can be formed of an inorganic material such as silicon nitride (SiNx), silicon oxide (SiOx), and silicon oxynitride (SiON), but is not limited thereto.

With reference to FIGS. 2 and 3, the first touch part 164 can be disposed on the first inorganic insulating layer 161. The first touch part 164 can be disposed on the first inorganic insulating layer 161 in the non-emission area NEA. Each of the first touch parts 164 can be spaced apart from each other and disposed in an X-axis direction and a Y-axis direction. For example, the first touch part 164 can include a plurality of patterns spaced apart from each other and disposed in the X-axis direction and a plurality of patterns disposed in the Y-axis direction. The first touch part 164 can supply a touch driving signal for driving the touch part 160. In addition, the first touch part 164 can transmit the touch information detected by the touch part 160 to the driver IC. The first touch part 164 can be formed in a mesh shape, but is not limited thereto. The first touch part 164 can be formed of a metal material, but is not limited thereto.

The second inorganic insulating layer 162 can be disposed on the first touch part 164 and the first inorganic insulating layer 161. The second inorganic insulating layer 162 can suppress a short circuit of the first touch parts 164 disposed adjacent to each other. The second inorganic insulating layer 162 can be formed of an inorganic material. For example, the second inorganic insulating layer 162 can be formed of an inorganic material such as silicon nitride (SiNx), silicon oxide (SiOx), and silicon oxynitride (SiON), but is not limited thereto.

A refractive index of the first inorganic insulating layer 161 and a refractive index of the second inorganic insulating layer 162 can be greater than a refractive index of the first inorganic encapsulation layer 151 and a refractive index of the second inorganic encapsulation layer 153. For example, the first inorganic encapsulation layer 151 and the second inorganic encapsulation layer 153 can be formed by adjusting the flow rate of ammonia gas to 100%, and the first inorganic insulating layer 161 and the second inorganic insulating layer 162 can be formed by adjusting the flow rate of ammonia gas to 30%. In this way, when the inorganic insulating layer is formed by adjusting the flow rate of ammonia gas differently, the physical properties of the inorganic insulating layer can be changed according to the flow rate of ammonia gas. For example, the refractive indexes of the first inorganic encapsulation layer 151 and the second inorganic encapsulation layer 153 can be different from those of the first inorganic insulating layer 161 and the second inorganic insulating layer 162. For example, the refractive index of the first inorganic encapsulation layer 151 and the refractive index of the second inorganic encapsulation layer 153 can be about 1.85 to 1.86, and the refractive index of the first inorganic insulating layer 161 and the refractive index of the second inorganic insulating layer 162 can be about 1.97 to 1.99. Accordingly, when the inorganic insulating layer is formed by differently adjusting the flow rate of ammonia gas, even if the materials that form the first inorganic encapsulation layer 151 and the second inorganic encapsulation layer 153 and the first inorganic insulating layer 161 and the second inorganic insulating layer 162 are the same, the refractive indexes thereof can be different.

With reference to FIGS. 2 and 3, the second touch part 165 is disposed on the first touch part 164 and the second inorganic insulating layer 162. The second touch part 165 can electrically connect disconnected portions of the first touch part 164 extending in the same direction. For example, with reference to FIG. 3, the first touch part 164 extending in the X-axis direction among the first touch parts 164 has no disconnected portion, but the first touch part 164 extending in the Y-axis direction has a disconnected portion for electrical insulation from the first touch part 164 extending in the X-axis direction. Accordingly, the second touch part 165 can electrically extend the first touch part 164 disposed in the Y-axis direction and disconnected. FIG. 2 illustrates that the second touch part 165 can be disposed on the first touch part 164, but is not limited thereto. For example, the first touch part 164 can be disposed on the second touch part 165.

The second touch part 165 disposed at an outermost portion of the display area AA extends to the pad part 140 of the non-display area NA, and can be electrically connected to the pad part 140. The second touch part 165 can detect a touch position on the display area AA, and the second touch part 165 can transmit touch information including the touch position to the pad part 140. However, embodiments of the present disclosure are not limited thereto. For example, the touch part 160 can be electrically connected to the pad part 140 through parts other than the first touch part 164 and the second touch part 165, or the first touch part 164 can be electrically connected to the pad part 140.

The organic insulating layer 163 can be disposed on the second touch part 165 and the second inorganic insulating layer 162. The organic insulating layer 163 can planarize the upper portion of the second touch part 165 and can protect components under the organic insulating layer 163. The organic insulating layer 163 can be formed of an epoxy-based or acrylic-based polymer, but is not limited thereto.

A polarizing plate can be further disposed on the touch part 160. The polarizing plate can be disposed on the touch part 160 to reduce reflection of external light incident on the display apparatus 100. In addition, various optical films, protective films, or the like can be further disposed on the touch part 160.

Figure 4:
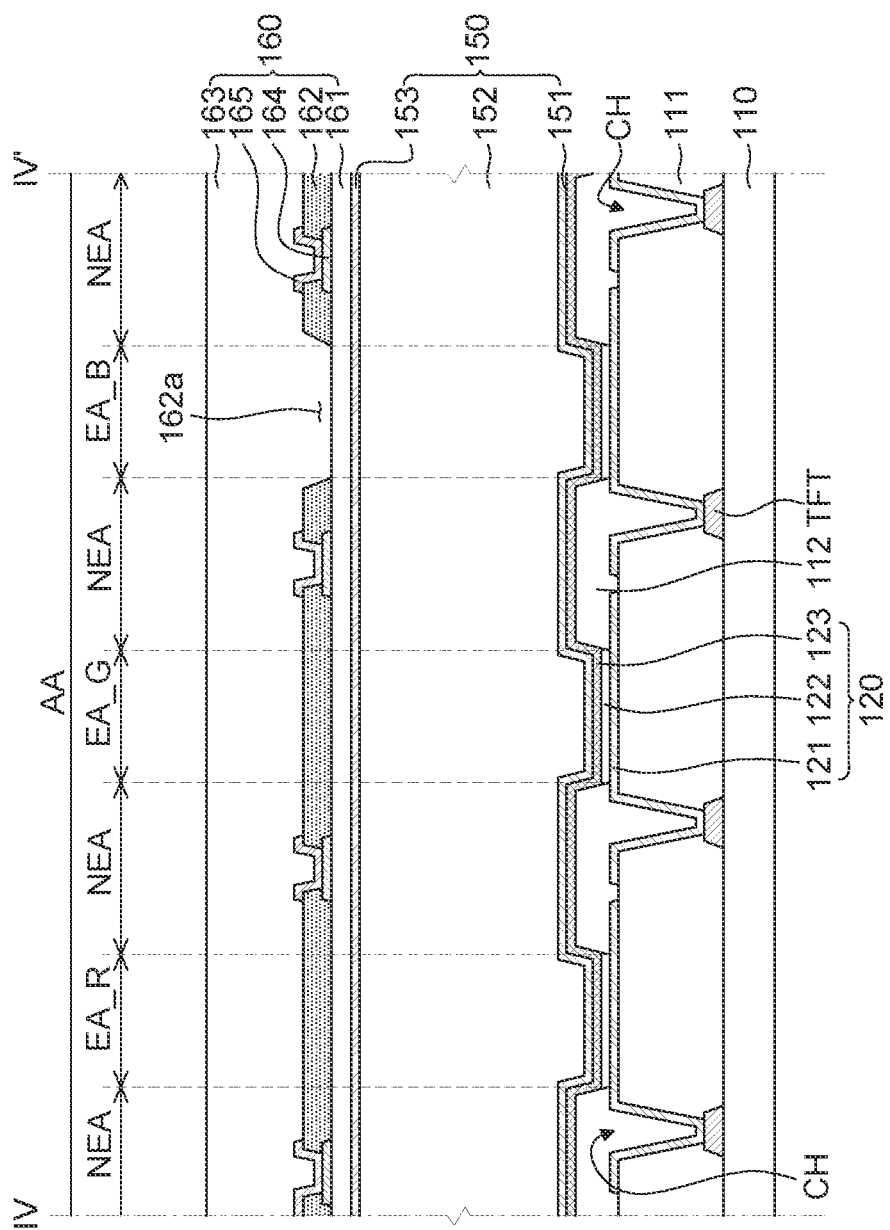
FIG. 4 is a cross-sectional view of the display apparatus taken along line IV-IV' of FIG. 1.

FIG. 4 is a cross-sectional view of the display apparatus taken along line IV-IV' of FIG. 1.

With reference to FIG. 4, the second inorganic insulating layer 162 can include an opening 162a. The opening 162a of the second inorganic insulating layer 162 can be disposed at an area overlapping the emission area. The opening 162a of the second inorganic insulating layer 162 can expose a part of a structure disposed under the second inorganic insulating layer 162 at the area overlapping the emission area. For example, the opening 162a of the second inorganic insulating layer 162 can expose a part of the first inorganic insulating layer.

An area of the opening 162a of the second inorganic insulating layer 162 can be the same as that of the emission area or can be larger than that of the emission area. For example, an end of the opening 162a of the second inorganic insulating layer 162 can be the same as that of the emission area or can be disposed in the non-emission area NEA adjacent to the emission area. Accordingly, the area of the first inorganic insulating layer 161 exposed by the opening 162a of the second inorganic insulating layer 162 can also be equal to or larger than that of the emission area. In the present disclosure, one area being equal to (or greater than or less than) another area includes an interpretation that a size or any one or dimensions of the one area is being equal to (or greater than or less than) the size or any one or more dimensions of such another area.

The opening 162a of the second inorganic insulating layer 162 can be disposed at an emission area of at least one of the plurality of sub-pixels. For example, as illustrated in FIG. 4, the opening 162a of the second inorganic insulating layer 162 can be disposed at the emission area EA_B of the blue sub-pixel among an emission area EA_R of a red sub-pixel, an emission area EA_G of a green sub-pixel, and an emission area EA_B of a blue sub-pixel. Accordingly, it is possible to improve the extraction efficiency of light emitted from the emission area EA_B of the blue sub-pixel.

Although the above-described structure of the touch part 160 has been described as being disposed in the second area A2 of the substrate 110, the touch part 160 can also be applied to the first area A1 which is the flat portion of the substrate 110. For example, when the touch parts 160 disposed at each of the first area A1 and the second area A2 of the substrate 110 have a different structure, the thickness of the second inorganic insulating layer 162 disposed at the first area A1 and the thickness of the second inorganic insulating layer 162 disposed at the second area A2 are different, and therefore, a step can occur at the second touch part 165 disposed on the second inorganic insulating layer 162. By disposing the touch part 160 having the same structure at the first area A1 and the second area A2, it is possible to reduce the occurrence of the step in the second touch part 165.

In the display apparatus having the bending area, the first inorganic insulating layer and the second inorganic insulating layer can be formed by lowering the flow rate of ammonia gas to reduce the cracks and moisture permeation in the bending area. In this case, the physical properties and refractive indexes of the first inorganic insulating layer and the second inorganic insulating layer can be changed. For example, compared to the case of forming the first inorganic insulating layer and the second inorganic insulating layer by adjusting the flow rate of the ammonia gas to 100%, when the first inorganic insulating layer and the second inorganic insulating layer are formed by adjusting the flow rate ratio of the ammonia gas to 30%, the refractive indexes of the first inorganic insulating layer and the second inorganic insulating layer can increase. Accordingly, due to the characteristics of the first and second inorganic insulating layers and the characteristics of the blue wavelength, some of the light emitted from the blue sub-pixel passes through the first inorganic insulating layer and the second inorganic insulating layer, and thus, the path of light can be changed. Accordingly, transmittance and viewing angle at the blue sub-pixel can decrease.

Accordingly, in the display apparatus 100 according to the embodiment of the present disclosure, by removing all or a portion of the second inorganic insulating layer 162 at the blue sub-pixel, it is possible to suppress the decrease in the transmittance and viewing angle at the blue sub-pixel. For example, the opening 162a of the second inorganic insulating layer 162 can be disposed at an area overlapping the emission area EA_B of the blue sub-pixel, and thus, a total thickness of the insulating layer, for example, the first inorganic insulating layer 161 and the second inorganic insulating layer 162 in which the flow rate ratio of ammonia gas disposed at the area overlapping the emission area EA_B of the blue sub-pixel is low can be reduced. Accordingly, the thickness of the inorganic insulating layer that changes the path of light emitted from the blue sub-pixel can be reduced. Accordingly, by disposing the opening 162a of the second inorganic insulating layer 162 at the area overlapping the emission area EA_B of the blue sub-pixel, it is possible to suppress the decrease in the transmittance and viewing angle at the blue sub-pixel.

In some embodiments of the present disclosure, when the display apparatus 100 is formed of a flexible display apparatus, the above-described structure of the touch part 160 can be applied to the entire area of the substrate 110. The flexible display apparatus is the display apparatus 100 that can be bent or folded freely, and the entire area of the substrate 110 can be the bending area. Accordingly, by applying the structure of the touch part 160 of the present disclosure to the entire area of the substrate 110, the stress generated at the bending area can be reduced and the reliability of the bending area can be improved.

In some embodiments of the present disclosure, when the display apparatus 100 is formed of a foldable display apparatus, the above-described structure of the touch part 160 can be applied to the folded area. The foldable display apparatus 100 is the display apparatus 100 that can be folded, and the folded area in which the display apparatus 100 is folded can be the bending area. Accordingly, by applying the structure of the touch part 160 of the present disclosure to the folded area of the substrate 110, the stress generated at the folding area can be reduced.

Figure 5:
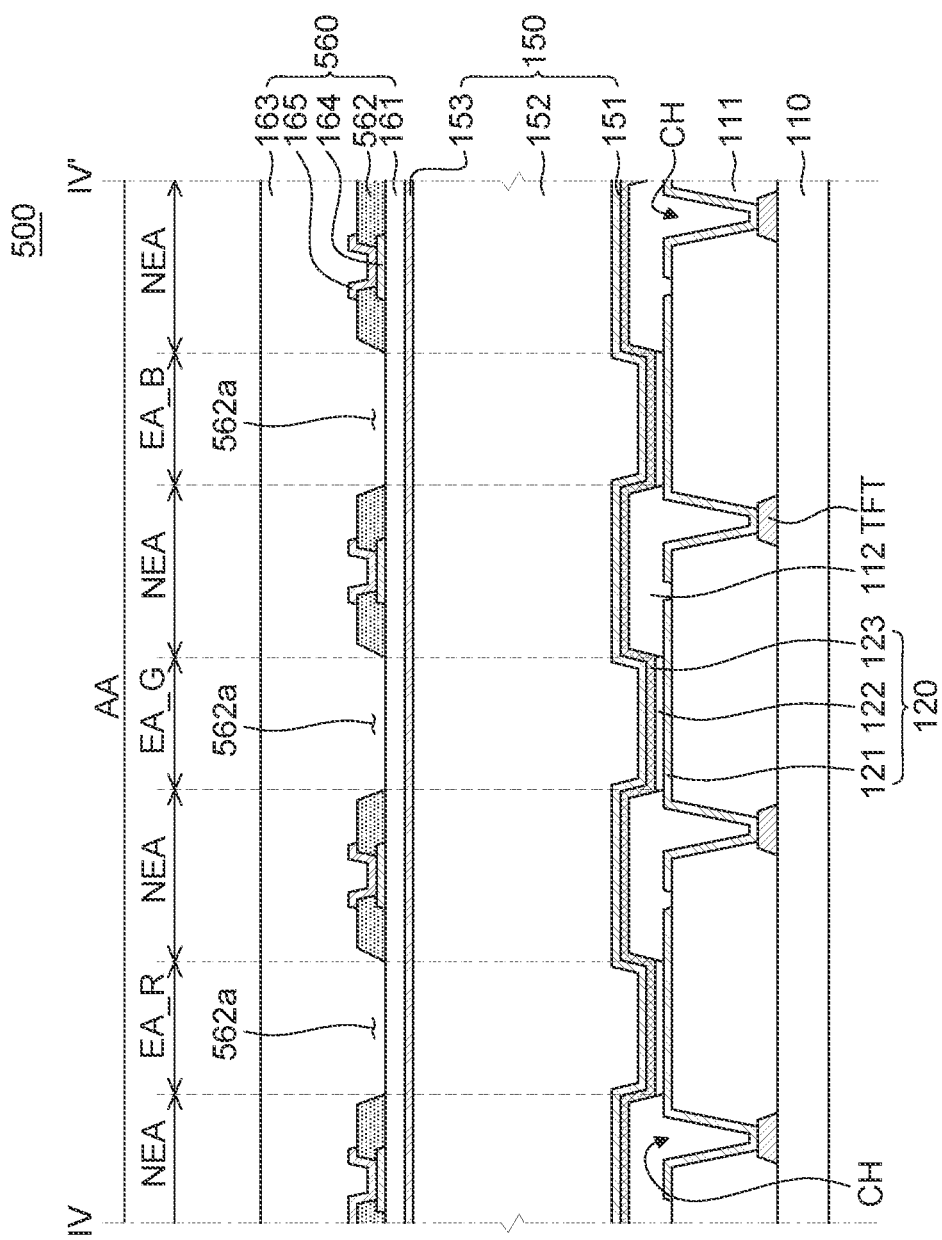
FIG. 5 is a cross-sectional view of a display apparatus taken along line IV-IV' of FIG. 1 according to another example of the present disclosure.

FIG. 5 is a cross-sectional view of the display apparatus taken along line IV-IV' of FIG. 1 according to another example of the present disclosure. A display apparatus 500 of FIG. 5 is different in a touch part 560 compared with the display apparatus 100 of FIGS. 1 to 4, and other components are substantially the same, and therefore, a redundant description thereof will be omitted or may be provided briefly.

With reference to FIG. 5, the second inorganic insulating layer 562 of the touch part 560 can include an opening 562a. The opening 562a of the second inorganic insulating layer 562 can be disposed at each of the plurality of sub-pixels. For example, the opening 562a of the second inorganic insulating layer 562 can be disposed to overlap the emission area EA_R of the red sub-pixel, the emission area EA_G of the green sub-pixel, and the emission area EA_B of the blue sub-pixel, respectively. Accordingly, the opening 562a of the second inorganic insulating layer 562 can expose a part of the first inorganic insulating layer 161 at each of the plurality of sub-pixels. It should be noted that the portion with a reduced thickness may be formed in the form of a blind hole except for an opening, as described with respect to FIG. 4.

In the display apparatus 500 according to another embodiment of the present disclosure, by removing all or a portion of the second inorganic insulating layer 562 at the plurality of sub-pixels, respectively, it is possible to suppress the decrease in the transmittance and viewing angle at each of the plurality of sub-pixels. For example, the opening 562a of the second inorganic insulating layer 562 can be disposed at areas overlapping the emission area EA_R of the red sub-pixel, the emission area EA_G of the green sub-pixel, and the emission area EA_B of the blue sub-pixel, respectively. Accordingly, the thickness of the inorganic insulating layer, for example, the second inorganic insulating layer 562 that changes the path of light emitted from a plurality of sub-pixels can be reduced. Accordingly, by disposing the opening 562a of the second inorganic insulating layer 562 at the areas overlapping the emission areas of each of the plurality of sub-pixels, it is possible to suppress the decrease in the transmittance and viewing angle at the plurality of sub-pixels.

Figure 6:
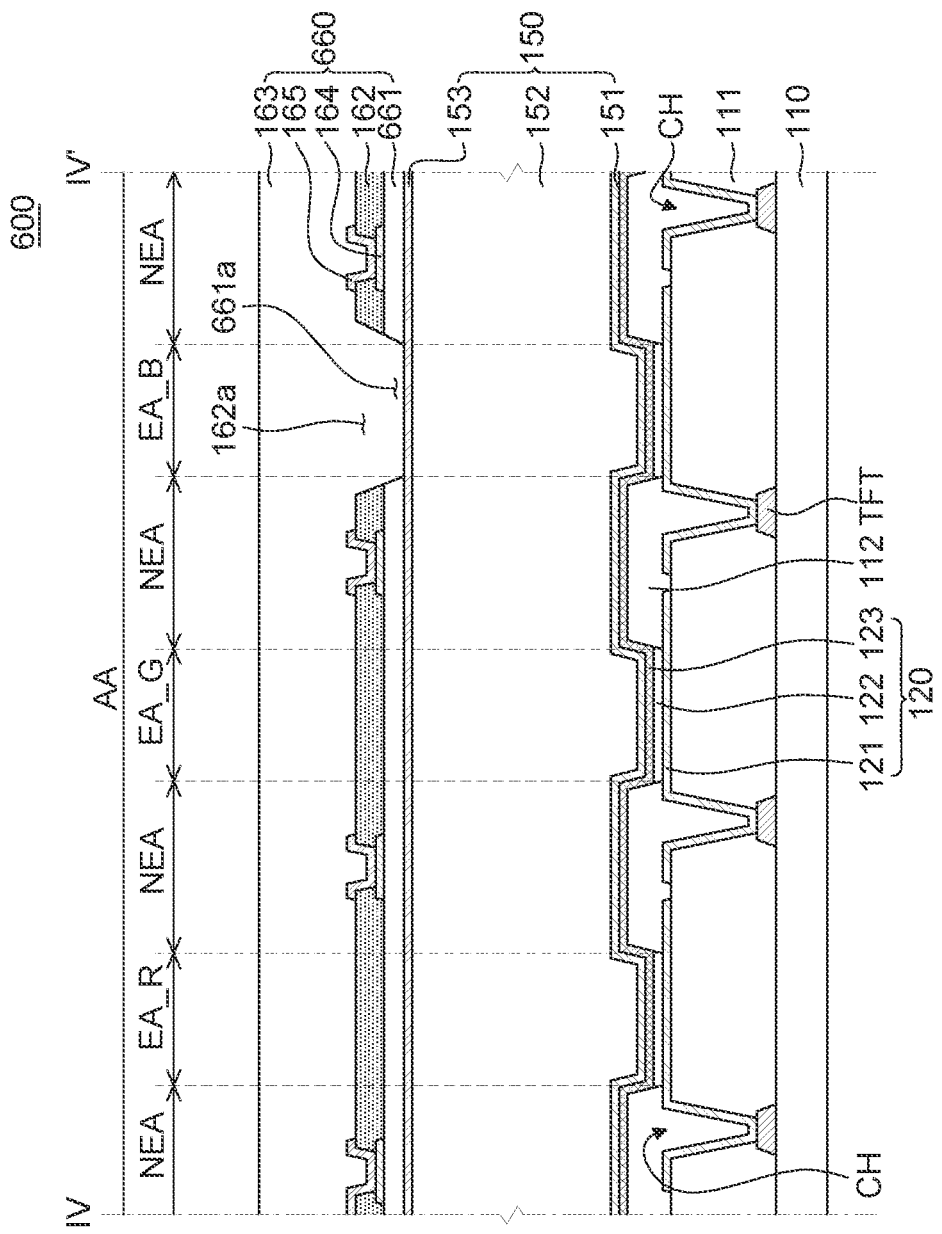
FIG. 6 is a cross-sectional view of a display apparatus taken along line IV-IV' of FIG. 1 according to another example of the present disclosure.

FIG. 6 is a cross-sectional view of a display apparatus taken along line IV-IV' of FIG. 1 according to another example of the present disclosure. A display apparatus 600 of FIG. 6 is different in a touch part 660 compared with the display apparatus 100 of FIGS. 1 to 4, and other components are substantially the same, and therefore, a redundant description thereof will be omitted or may be provided briefly.

With reference to FIG. 6, a first inorganic insulating layer 661 of the touch part 660 can include an opening 661a. The opening 661a of the first inorganic insulating layer 661 can be disposed at an area overlapping the opening 162a of the second inorganic insulating layer 162. For example, the opening 661a of the first inorganic insulating layer 661 can be disposed at the area overlapping the emission area EA_B of the blue sub-pixel. Accordingly, the opening 162a of the first inorganic insulating layer 661 can expose a part of a structure disposed under the first inorganic insulating layer 661. For example, the opening 162a of the first inorganic insulating layer 661 can expose a part of the second inorganic encapsulation layer 153.

An area of the opening 661a of the first inorganic insulating layer 661 can be the same as that of the emission area or can be larger than that of the emission area. For example, an end of the opening 162a of the first inorganic insulating layer 661 can be the same as that of the emission area or can be disposed in the non-emission area NEA adjacent to the emission area. Accordingly, the area of the second inorganic encapsulation layer 153 exposed by the opening 162a of the first inorganic insulating layer 661 can also be equal to or larger than that of the emission area.

The opening 661a of the first inorganic insulating layer 661 can be disposed in an emission area of at least one of the plurality of sub-pixels. For example, the opening 661a of the first inorganic insulating layer 661 can be disposed only in the emission area EA_B of the blue sub-pixel among the emission area EA_R of the red sub-pixel, the emission area EA_G of the green sub-pixel, and the emission area EA_B of the blue sub-pixel. Accordingly, it is possible to improve the extraction efficiency of light emitted from the emission area EA_B of the blue sub-pixel.

In the display apparatus 600 according to another embodiment of the present disclosure, by removing all or a portion of the first inorganic insulating layer 661 and the second inorganic insulating layer 162 from the blue sub-pixel, it is possible to suppress the decrease in the transmittance and viewing angle at the blue sub-pixel. For example, the opening 661a of the first inorganic insulating layer 661 and the opening 162a of the second inorganic insulating layer 162 can be disposed at the area overlapping the emission area EA_B of the blue sub-pixel. Accordingly, the thickness of the inorganic insulating layer, for example, the first inorganic insulating layer 661 and the second inorganic insulating layer 162 that change the path of light emitted from the blue sub-pixel can be reduced. Accordingly, by disposing the opening 661a of the first inorganic insulating layer 661 and the opening 162a of the second inorganic insulating layer 162 in the area overlapping the emission area EA_B of the blue sub-pixel, it is possible to suppress the decrease in the transmittance and viewing angle in the blue sub-pixel.

Figure 7:
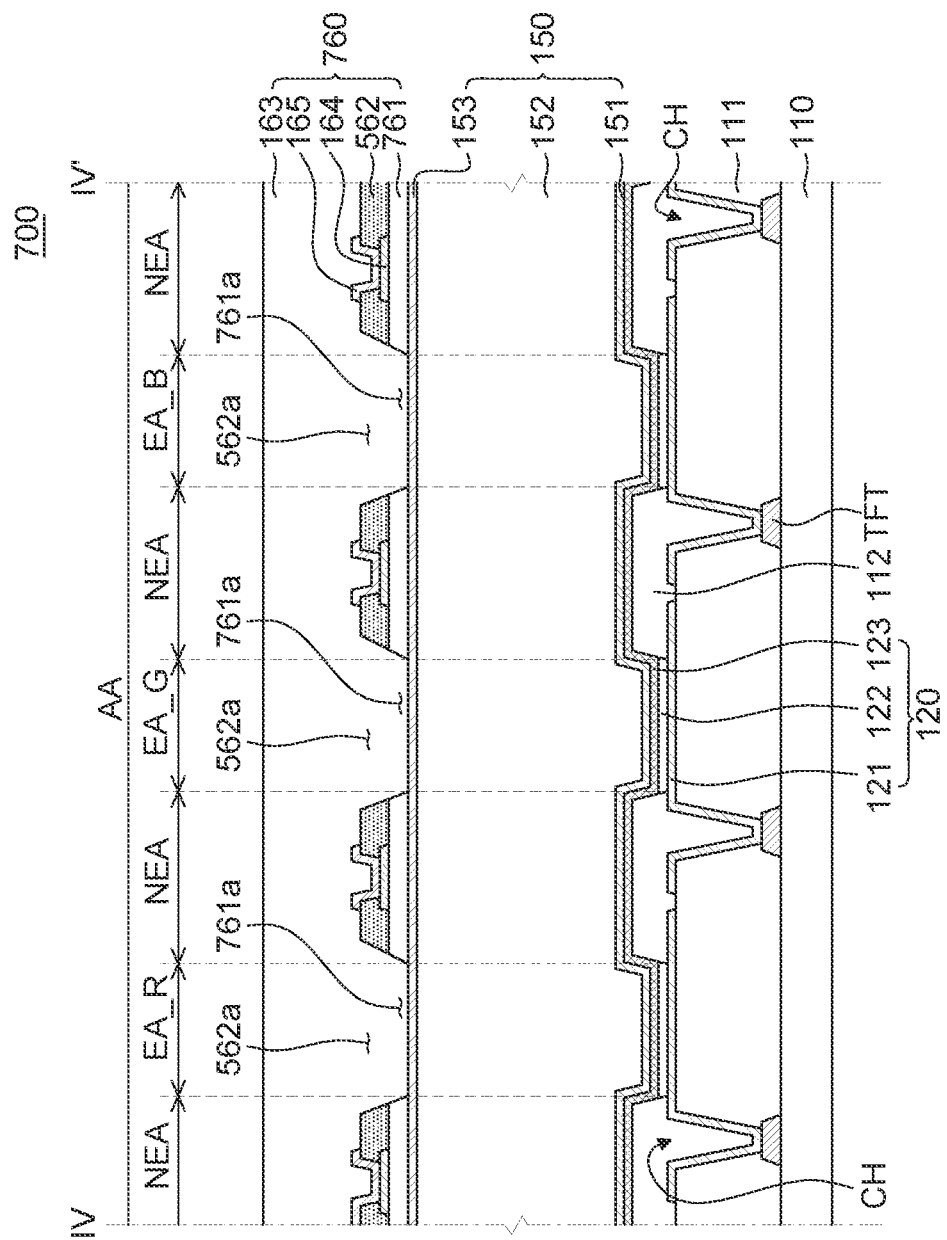
FIG. 7 is a cross-sectional view of a display apparatus taken along line IV-IV' of FIG. 1 according to another example of the present disclosure.

FIG. 7 is a cross-sectional view of a display apparatus taken along line IV-IV' of FIG. 1 according to another example of the present disclosure. A display apparatus 700 of FIG. 7 is different in a touch part 760 compared with the display apparatus 500 of FIG. 5, and other components are substantially the same, and therefore, a redundant description thereof will be omitted or may be provided briefly.

With reference to FIG. 7, the opening 562a of the second inorganic insulating layer 562 can be disposed at each of the plurality of sub-pixels. For example, the opening 562a of the second inorganic insulating layer 562 can be disposed to overlap the emission area EA_R of the red sub-pixel, the emission area EA_G of the green sub-pixel, and the emission area EA_B of the blue sub-pixel, respectively.

With reference to FIG. 7, an opening 761a of a first inorganic insulating layer 761 can be disposed at an area overlapping the opening 562a of the second inorganic insulating layer 562. For example, the opening 761a of the first inorganic insulating layer 761 can be disposed at emission areas in each of the plurality of sub-pixels and an area overlapping the opening 761a of the second inorganic insulating layer 562. Accordingly, the opening 761a of the first inorganic insulating layer 761 can expose a part of a structure disposed under the first inorganic insulating layer 761. For example, the opening 562a of the first inorganic insulating layer 761 can expose a part of the second inorganic encapsulation layer 153 at each of the plurality of sub-pixels.

The opening 761a of the first inorganic insulating layer 761 can be disposed at each of the plurality of sub-pixels. For example, the opening 761a of the first inorganic insulating layer 761 can be disposed at the emission area EA_R of the red sub-pixel, the emission area EA_G of the green sub-pixel, and the emission area EA_B of the blue sub-pixel, respectively. Accordingly, it is possible to improve the extraction efficiency of light emitted from the emission areas of the red sub-pixel, the green sub-pixel, and the blue sub-pixel.

In the display apparatus 700 according to another embodiment of the present disclosure, by removing the first inorganic insulating layer 760 and the second inorganic insulating layer 562 from each of the plurality of sub-pixels, it is possible to suppress the decrease in the transmittance and viewing angle at each of the plurality of sub-pixels. For example, the opening 761a of the first inorganic insulating layer 761 and the opening 562a of the second inorganic insulating layer 562 can be disposed at areas overlapping the emission area EA_R of the red sub-pixel, the emission area EA_G of the green sub-pixel, and the emission area EA_B of the blue sub-pixel, respectively. Accordingly, the thickness of the inorganic insulating layer, for example, the first inorganic insulating layer 761 and the second inorganic insulating layer 562 that change the path of light emitted from the plurality of sub-pixels can be reduced. Accordingly, by disposing the opening 761a of the first inorganic insulating layer 761 and the opening 562a of the second inorganic insulating layer 562 at each of the areas overlapping the emission areas of each of the plurality of sub-pixels, it is possible to suppress the decrease in the transmittance and viewing angle in the plurality of sub-pixels.

A display apparatus according to one or more embodiments of the present disclosure will be described below.

According to an embodiment of the present disclosure, a display apparatus comprises a substrate having a display area including a plurality of sub-pixels formed of an emission area and a non-emission area, a plurality of light emitting diodes disposed at the plurality of sub-pixels, an encapsulation part covering the plurality of light emitting diodes in the display area, a first inorganic insulating layer disposed on the encapsulation part, a first touch part disposed on the first inorganic insulating layer, a second inorganic insulating layer disposed on the first touch part and including an opening disposed at an area overlapping the emission area disposed at one or more sub-pixels among the plurality of sub-pixels, and a second touch part disposed on the first inorganic insulating layer and the second inorganic insulating layer.

According to some embodiments of the present disclosure, an area of the opening of the second inorganic insulating layer can be equal to or larger than that of the emission area.

According to some embodiments of the present disclosure, the opening of the second inorganic insulating layer can be disposed in each of the plurality of sub-pixels.

According to some embodiments of the present disclosure, the first inorganic insulating layer can include an opening disposed in an area overlapping the opening of the second inorganic insulating layer.

According to some embodiments of the present disclosure, an area of the opening of the first inorganic insulating layer can be equal to or larger than that of the emission area.

According to some embodiments of the present disclosure, the opening of the first inorganic insulating layer can be disposed in each of the plurality of sub-pixels.

According to some embodiments of the present disclosure, the sub-pixel in which the opening of the second inorganic insulating layer is disposed can include a blue sub-pixel.

According to some embodiments of the present disclosure, the substrate can include a curved portion, and the opening of the second inorganic insulating layer can be disposed at the curved portion.

According to some embodiments of the present disclosure, the encapsulation part can include a first encapsulation layer disposed on the plurality of light emitting diodes; an organic encapsulation layer disposed on the first encapsulation layer; and a second encapsulation layer disposed on the organic encapsulation layer. A refractive index of the first encapsulation layer and a refractive index of the second encapsulation layer can be smaller than a refractive index of the first inorganic insulating layer or a refractive index of the second inorganic insulating layer.

According to another embodiment of the present disclosure, a display apparatus comprises a substrate including a display area and a non-display area, a plurality of sub-pixels disposed at the display area and including an emission area and a non-emission area, a plurality of light emitting diodes disposed on the plurality of sub-pixels, an encapsulation part disposed on the plurality of sub-pixels; a first inorganic insulating layer disposed on the encapsulation part, a first touch part disposed at a portion of the first inorganic insulating layer, a second inorganic insulating layer disposed on the first touch part, and a second touch part disposed on the second inorganic insulating layer. The first inorganic insulating layer at one or more sub-pixels of the plurality of sub-pixels is exposed at an area corresponding to the emission area.

According to some embodiments of the present disclosure, the first inorganic insulating layer at each of the plurality of sub-pixels can be exposed at the area corresponding to the emission area.

According to some embodiments of the present disclosure, an area to which the first inorganic insulating layer is exposed can be equal to or larger than that of the emission area.

According to some embodiments of the present disclosure, the encapsulation part can include a first encapsulation layer disposed on the plurality of light emitting diodes, an organic encapsulation layer disposed on the first encapsulation layer, and a second encapsulation layer disposed on the organic encapsulation layer. The second encapsulation layer can be exposed at the area corresponding to the emission area.

According to some embodiments of the present disclosure, the second encapsulation layer can be disposed to be exposed at each of the plurality of sub-pixels. An area to which the second encapsulation layer is exposed can be equal to or larger than that of the emission area.

According to some embodiments of the present disclosure, the first touch part can be disposed in a mesh shape.

According to some embodiments of the present disclosure, the substrate can include one or more curved portions. An opening of the second inorganic insulating layer can be disposed at the curved portion.

It will be apparent to those skilled in the art that various modifications and variations can be made in the present disclosure without departing from the technical idea or scope of the disclosures. Thus, it can be intended that embodiments of the present disclosure covers the modifications and variations of the disclosure provided they come within the scope of the appended claims and their equivalents.

What is claimed is:
1. A display apparatus, comprising:
a substrate including a first area having a flat portion and a second area having a curved portion;
a transistor on the substrate;
a dam on a non-display area in the first area and the second area of the substrate;
an encapsulation part on the transistor, the encapsulation part including a first inorganic encapsulation layer, a second inorganic encapsulation layer and an organic encapsulation layer between the first inorganic encapsulation layer and second inorganic encapsulation layer;
a first inorganic insulating layer on the encapsulation part in the first area and the second area;
a first touch part on the first inorganic insulating layer in the first area and the second area;

a second inorganic insulating layer on the first touch part in the first area and the second area; and a second touch part on the second inorganic insulating layer in the first area and the second area, wherein the first inorganic encapsulation layer, the second inorganic encapsulation layer, the first inorganic insulating layer and the second inorganic insulating layer extend from the dam in a direction toward an edge of the substrate, wherein the second touch part has a mesh shape, wherein the substrate includes a display area in the first area and the second area, wherein the display area includes a plurality of sub-pixels, and wherein the second inorganic insulating layer includes an opening disposed at an area overlapping with the second area corresponding to at least one of the plurality of sub-pixels.

2. The display apparatus of claim 1, wherein the second area is disposed adjacent to at least one side of the first area.

3. The display apparatus of claim 1, further comprising: a pad part on the non-display area.

4. The display apparatus of claim 3, wherein the pad part is in contact with the second touch part.

5. The display apparatus of claim 1, wherein the first inorganic encapsulation layer contacts the second inorganic encapsulation layer at an outer portion of the substrate to seal the organic encapsulation layer.

6. The display apparatus of claim 1,
wherein the plurality of sub-pixels include an emission area and a non-emission area, and
wherein at least a portion of the first inorganic insulating layer or at least a portion of the encapsulation part is exposed at one or more sub-pixels among the plurality of sub-pixels in an area corresponding to the emission area.

7. The display apparatus of claim 6, wherein a part of the first inorganic insulating layer adjacent to the opening in the second inorganic insulting layer is exposed by the opening in the second inorganic insulting layer.

8. The display apparatus of claim 6, wherein the opening in the second inorganic insulating layer includes a plurality of openings corresponding to the plurality of sub-pixels.

9. The display apparatus of claim 6, wherein the first inorganic insulating layer includes an opening overlapping with the opening in the second inorganic insulating layer.

10. The display apparatus of claim 9, wherein a part of the encapsulation part adjacent to the opening in the first inorganic insulting layer is exposed by the opening in the first inorganic insulting layer.

11. The display apparatus of claim 9, wherein the opening in the first inorganic insulating layer includes a plurality of openings corresponding to the plurality of sub-pixels.

12. The display apparatus of claim 9 wherein the opening in the first inorganic insulating layer is smaller than the opening in the second inorganic insulating layer.

13. The display apparatus of claim 6, wherein the opening in the second inorganic insulating layer overlaps with a blue sub-pixel among the plurality of sub-pixels.

14. The display apparatus of claim 6, wherein the opening in the second inorganic insulating layer is disposed at the second area having the curved portion.

15. The display apparatus of claim 6, further comprising: a bank layer including a plurality of openings corresponding to the plurality of sub-pixels, respectively, wherein one of the plurality of openings in the bank layer overlaps with the opening in the second inorganic insulating layer.

16. The display apparatus of claim 1, wherein a refractive index of the first inorganic encapsulation layer and a refractive index of the second inorganic encapsulation layer are less than a refractive index of the first inorganic insulating layer or a refractive index of the second inorganic insulating layer.

17. A display apparatus, comprising:
a substrate including a first area having a flat portion and a second area having a curved portion;
a transistor on the substrate;
a dam on a non-display area in the first area and the second area of the substrate;
an encapsulation part on the transistor, the encapsulation part including a first inorganic encapsulation layer, a second inorganic encapsulation layer and an organic encapsulation layer between the first inorganic encapsulation layer and second inorganic encapsulation layer;
a first inorganic insulating layer on the encapsulation part in the first area and the second area;
a first touch part on the first inorganic insulating layer in the first area and the second area;
a second inorganic insulating layer on the first touch part in the first area and the second area; and
a second touch part on the second inorganic insulating layer in the first area and the second area,
wherein the first inorganic encapsulation layer, the second inorganic encapsulation layer, the first inorganic insulating layer and the second inorganic insulating layer extend from the dam in a direction toward an edge of the substrate,
wherein the second touch part has a mesh shape,
wherein the substrate includes a display area in the first area and the second area,
wherein the display area includes a plurality of sub-pixels,
wherein at least a portion of the first inorganic insulating layer or at least a portion of the encapsulation part is exposed at one or more sub-pixels among the plurality of sub-pixels in an area corresponding to the second area, and
wherein the second inorganic insulating layer includes an opening disposed at an area overlapping with the second area, the opening corresponding to at least one of the plurality of sub-pixels.

18. A display apparatus, comprising:
a substrate including a first area having a flat portion and a second area having a curved portion;
a transistor on the substrate;
a dam on a non-display area in the first area and the second area of the substrate;
an encapsulation part on the transistor, the encapsulation part including a first inorganic encapsulation layer, a second inorganic encapsulation layer and an organic encapsulation layer between the first inorganic encapsulation layer and second inorganic encapsulation layer;
a first inorganic insulating layer on the encapsulation part in the first area and the second area;
a first touch part on the first inorganic insulating layer in the first area and the second area;
a second inorganic insulating layer on the first touch part in the first area and the second area; and
a second touch part on the second inorganic insulating layer in the first area and the second area, wherein the first inorganic encapsulation layer, the second inorganic encapsulation layer, the first inorganic insulating layer and the second inorganic insulating layer extend from the dam in a direction toward an edge of the substrate,
wherein the second touch part has a mesh shape, and
wherein a refractive index of the first inorganic encapsulation layer and a refractive index of the second inorganic encapsulation layer are less than a refractive index of the first inorganic insulating layer or a refractive index of the second inorganic insulating layer.

* * * * *